United States Patent
Park

(10) Patent No.: US 9,564,612 B2
(45) Date of Patent: Feb. 7, 2017

(54) ORGANIC LIGHT EMITTING DISPLAY

(71) Applicant: SAMSUNG DISPLAY CO., LTD, Yongin, Gyeonggi-Do (KR)

(72) Inventor: Won Sang Park, Gyeonggi-do (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 131 days.

(21) Appl. No.: 14/056,391

(22) Filed: Oct. 17, 2013

(65) Prior Publication Data

US 2015/0001474 A1   Jan. 1, 2015

(30) Foreign Application Priority Data

Jul. 1, 2013  (KR) .................. 10-2013-0076464

(51) Int. Cl.
*H01L 51/52* (2006.01)
*H01L 27/32* (2006.01)

(52) U.S. Cl.
CPC ....... *H01L 51/5271* (2013.01); *H01L 51/5209* (2013.01); *H01L 51/5218* (2013.01); *H01L 51/5221* (2013.01); *H01L 51/5225* (2013.01); *H01L 27/3244* (2013.01); *H01L 51/5284* (2013.01); *H01L 2251/5315* (2013.01)

(58) Field of Classification Search
CPC ............. H01L 51/5271; H01L 51/5209; H01L 51/5221; H01L 51/5218; H01L 51/5225; H01L 27/3244–27/3279
USPC ...................... 257/40–103; 313/504; 428/690
See application file for complete search history.

(56) References Cited

U.S. PATENT DOCUMENTS

| | | | |
|---|---|---|---|
| 2007/0069635 A1* | 3/2007 | Cok | ............................... 313/504 |
| 2007/0085471 A1* | 4/2007 | Cok | ................... H01L 51/5203 313/503 |
| 2008/0197342 A1* | 8/2008 | Lee et al. | ........................ 257/40 |
| 2008/0278063 A1* | 11/2008 | Cok | ............................... 313/500 |
| 2011/0303930 A1* | 12/2011 | Bang et al. | ..................... 257/91 |
| 2014/0027731 A1* | 1/2014 | Kim et al. | ....................... 257/40 |

FOREIGN PATENT DOCUMENTS

| | | |
|---|---|---|
| JP | 2012038441 | 2/2012 |
| KR | 1020060104673 | 10/2006 |
| KR | 1020110049476 | 5/2011 |
| KR | 1020120076940 | 7/2012 |

* cited by examiner

*Primary Examiner* — Stephen W Smoot
*Assistant Examiner* — Sun M. Kim
(74) *Attorney, Agent, or Firm* — F. Chau & Associates, LLC

(57) ABSTRACT

An organic light emitting display includes a first substrate, a first electrode, a second electrode, a second substrate, and an organic light emitting layer. The first electrode is disposed on the substrate. The second electrode is disposed on the first electrode. The second substrate is disposed on the second electrode. The organic light emitting layer is interposed between the first electrode and the second electrode. The first electrode and the second electrode are reflective. The first electrode and the second electrode are configured to guide light emitted from the organic light emitting layer to the first substrate or the second substrate.

18 Claims, 12 Drawing Sheets

500

ORGANIC LIGHT EMITTING DISPLAY

CROSS-REFERENCE TO RELATED APPLICATION

This application claims priority under 35 U.S.C. §119 to Korean Patent Application No. 10-2013-0076464, filed on Jul. 1, 2013 in the Korean Intellectual Property Office, the disclosure of which is incorporated by reference herein in its entirety.

TECHNICAL FIELD

The present invention relates to an organic light emitting display.

DISCUSSION OF RELATED ART

Organic light emitting displays are self-emitting type displays. Organic light emitting displays have characteristics such as excellent display viewing angle, contrast ratio, and the like. Further, Organic light emitting displays do not require a backlight, and therefore lightweight, slim, and less-power consuming. Organic light emitting displays may be driven at a low DC voltage and have a rapid response speed.

SUMMARY

According to an exemplary embodiment of the present invention, an organic light emitting display includes a first substrate, a first electrode, a second electrode, a second substrate, and an organic light emitting layer. The first electrode is disposed on the substrate. The second electrode is disposed on the first electrode. The second substrate is disposed on the second electrode. The organic light emitting layer is interposed between the first electrode and the second electrode. The first electrode and the second electrode are reflective. The first electrode and the second electrode are configured to guide light emitted from the organic light emitting layer to the first substrate or the second substrate.

According to an exemplary embodiment of the present invention, an organic light emitting display includes a first substrate, a first electrode, a second electrode, a second substrate, and an organic light emitting layer. The first electrode is disposed on the substrate. The second electrode is disposed on the first electrode. The second substrate disposed on the second electrode. The organic light emitting layer is interposed between the first electrode and the second electrode. The first electrode and the second electrode are reflective. The second electrode includes a first opening exposing a portion of the organic light emitting layer.

According to an exemplary embodiment of the present invention, an organic light emitting display include a first substrate, a light absorbing layer, a first electrode, a second electrode, an organic light emitting layer. The light absorbing layer is disposed on the first substrate. The light absorbing layer includes a first opening. The first electrode is disposed on the light absorbing layer. The second electrode is disposed on the first electrode. The second electrode includes an inclined side. The organic light emitting layer is interposed between the first electrode and the second electrode. The first electrode and the second electrode are reflective. The inclined side of the second electrode overlaps the first opening, thereby light emitted from the organic light emitting layer being guided to the first substrate through the first opening.

BRIEF DESCRIPTION OF THE DRAWINGS exemplary embodiment These and other features of the inventive concept will become more apparent by describing in detail exemplary exemplary embodiments thereof with reference to the accompanying drawings of which:

DETAILED DESCRIPTION OF THE EMBODIMENTS

Figure 1:
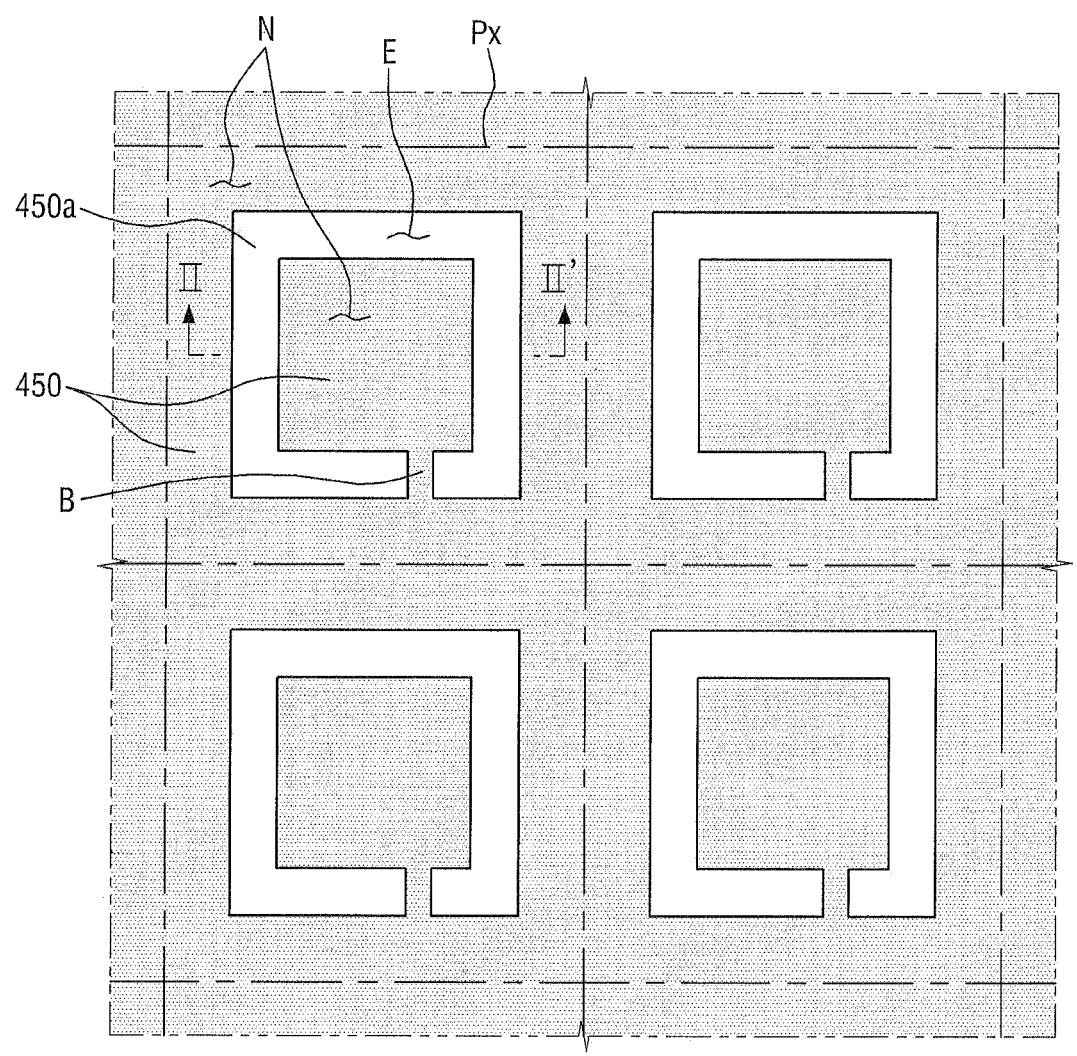
FIG. 1 is a plan view of an organic light emitting display according to an exemplary embodiment of the present invention.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when a layer is referred to as being "on" another layer or substrate, it may be directly on the other layer or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Figure 2:
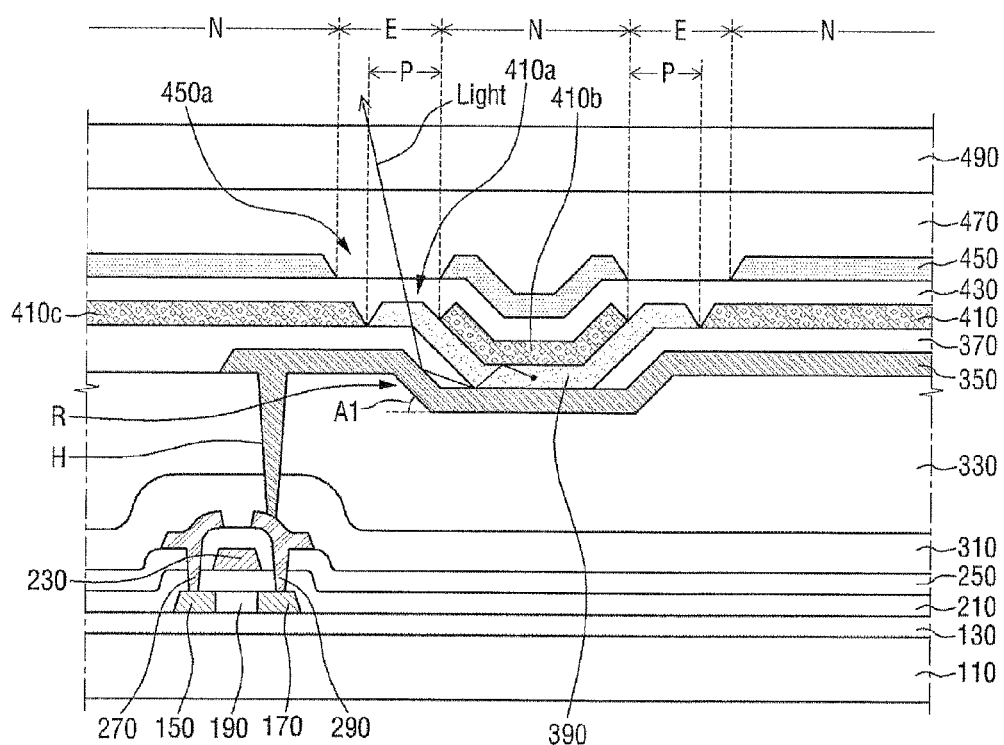
FIG. 2 is a cross-sectional view of the organic light emitting display taken along line II-II' in FIG. 1.

FIG. 1 is a plan view of an organic light emitting display 100 according to an exemplary embodiment of the present invention. FIG. 2 is a cross-sectional view of the organic light emitting display 100 taken along line II-II' in FIG. 1.

Referring to FIGS. 1 and 2, the organic light emitting display 100 is a top emission type and includes a plurality of pixels PXs. The organic light emitting display 100 includes a first substrate 110, a buffer layer 130, semiconductor patterns 150, 170, and 190, a gate insulating film 210, a gate electrode 230, an interlayer insulating film 250, a source electrode 270, a drain electrode 290, a first passivation film 310, an insulating layer 330, a first electrode 350, a pixel defined film 370, an organic light emitting layer 390, a second electrode 410, a second passivation film 430, a light absorbing layer 450, an adhesive layer 470, and a second substrate 490. The order of listed elements as described above may be a stacked order of the elements at the time of manufacturing the organic light emitting display 100 according to an exemplary embodiment of the present invention.

The plurality of pixels PXs is arranged on the first substrate 100 in a matrix form. Each pixel Px includes a luminescent region E and a non-luminescent region N. The luminescent region E is a region in which light emitted from the organic light emitting layer 390 is emitted to the outside of the organic light emitting display 100. The non-luminescent region N is a region in which the light emitted from the organic light emitting layer 390 is not emitted to the outside of the organic light emitting display 100. The detailed description of the luminescent region E and the non-luminescent region N will be described below.

The first substrate 110 may include a transparent insulating substrate. For example, the first substrate 110 may be a glass substrate, a quartz substrate, a transparent resin substrate, and the like. The transparent resin substrate, which may be used as the first substrate 110, may include, but is not limited to, polyimide resin, acrylic resin, polyacrylate resin, polycarbonate resin, polyether resin, polyethylene terephthalate resin, or sulfonic acid resin.

The buffer layer 130 is formed on the first substrate 110. The buffer layer 130 may serve to prevent metal atoms, impurities, and the like, from being diffused from the first substrate 110 to other elements that are formed on the buffer layer 130. Further, when a surface of the first substrate 110 is non-uniform, the buffer layer 130 may also serve to improve flatness of the surface of the first substrate 110. The buffer layer 130 may be made of a silicon compound including, but is not limited to, silicon oxide, silicon nitride, silicon oxynitride, silicon oxycarbide, or silicon carbonitride. These materials may be used either alone or in combination thereof. The buffer layer 130 may have a single layer structure or a multilayer structure which includes a silicon compound. For example, the buffer layer 130 may include a silicon oxide film, a silicon nitride film, a silicon oxynitride film, a silicon oxycarbide film, and/or a silicon carbonitride film. The buffer layer 130 may be omitted depending on the surface flatness, the constituent materials, and the like, of the first substrate 110.

The semiconductor patterns 150, 170, and 190 are formed on the buffer layer 130. After a semiconductor layer (not illustrated) is formed on the buffer layer, a reserved semiconductor pattern (not illustrated) may be formed on one side of the buffer layer 130 by patterning the semiconductor layer. Next, the semiconductor patterns 150, 170, and 190 may be formed on the buffer layer 130 by crystallizing the reserved semiconductor pattern. These semiconductor patterns 150, 170, and 190 may include a source region 150, a drain region 170, and a channel region 190 and may be made of polysilicon, an oxide semiconductor, and the like.

The gate insulating film 210 is formed to cover the semiconductor patterns 150, 170, and 190 on the buffer layer 130. The gate insulating film 210 may be made of silicon oxide, metal oxide, and the like. The metal oxide may include, but is not limited to, hafnium oxide (HfOx), aluminum oxide (AlOx), zirconium oxide (ZrOx), titanium oxide (TiOx), or tantalum oxide (TaOx). These materials may be used either alone or in combination thereof. The gate insulating film 210 may be substantially uniformly formed on the buffer layer 130 along profiles of the semiconductor patterns 150, 170, and 190. The gate insulating film 210 may have a relatively thin thickness and the gate insulating film 210 may be formed with stepped parts adjacent to the semiconductor patterns 150, 170, and 190. Alternatively, the gate insulating film 210 may sufficiently cover the semiconductor patterns 150, 170, and 190 thereby having a sufficiently flat upper surface. In this case, the gate insulating film 210 may have a relatively thick thickness.

The gate electrode 230 is formed on the gate insulating film 210. The gate electrode 230 is formed on a portion at which the semiconductor patterns 150, 170, and 190 are disposed, in a lower portion of the gate insulating film 210. The gate electrode 230 may include, but is not limited to, metal, alloy, metal nitride, conductive metal oxide, or transparent conductive materials. For example, the gate electrode 230 may include aluminum (Al), aluminum-containing alloy, aluminum nitride (AlNx), silver (Ag), silver-containing alloy, tungsten (W), tungsten nitride (WNx), copper (Cu), copper-containing alloy, nickel (Ni), chromium, chromium nitride (CrOx), molybdenum (Mo), molybdenum-containing alloy, titanium (Ti), titanium nitride (TiNx), platinum (Pt), tantalum (Ta), tantalum nitride (TaNx), neodymium (Nd), scandium (Sc), strontium ruthenium oxide (SrRuxOy), zinc oxide (ZnOx), indium tin oxide (ITO), tin oxide (SnOx), indium oxide (InOx), gallium oxide (GaOx), or indium zinc oxide (IZO). These materials may be used either alone or in combination thereof. The gate electrode 230 may have a single layer structure which is made of metal, alloy, metal nitride, conductive metal oxide, or transparent conductive materials as described above. Alternatively, the gate electrode 230 may have a multilayer structure which is made of metal, alloy, metal nitride, conductive metal oxide, and/or transparent conductive materials as described above. The gate electrode 230 may have a width smaller than that of the semiconductor patterns 150, 170, and 190. For example, the gate electrode 230 may have a width substantially the same as or substantially similar to that of the channel region 190. However, a dimension of the gate electrode 230 and/or a dimension of the channel region 190 may vary depending on electrical characteristics which are required for switching devices including the gate electrode 230 and the channel region 190.

The interlayer insulating film 250 is formed on the gate insulating film 210 to cover the gate electrode 230. The interlayer insulating film 250 may have substantially a uniform thickness, depending on the profiles of the gate electrode 230. Therefore, the interlayer insulating film 250 has stepped parts adjacent to the gate electrode 230. The interlayer insulating film 250 may be made of a silicon compound including, but is not limited to, silicon oxide, silicon nitride, silicon oxynitride, silicon carbonitride, or silicon oxycarbide. These materials may be used either alone or in combination thereof. Further, the interlayer insulating film 250 may have a single layer or a multilayer structure which includes, but is not limited to, silicon oxide, silicon nitride, silicon oxynitride, silicon carbonitride, or silicon oxycarbide, which are described above. The interlayer insulating film 250 may serve to insulate the gate electrode 230 from the source electrode 270 and the drain electrode 290 which are formed subsequently.

The source electrode 270 and the drain electrode 290 are formed on the interlayer insulating film 250. The source and drain electrodes 270 and 290 are spaced apart from each other at a predetermined interval based on the gate electrode 230 and are disposed to be adjacent to the gate electrode 230. For example, the source and drain electrodes 270 and 290 are extended from the interlayer insulating film 250 disposed above the source and drain regions 150 and 170 to the interlayer insulating film 250 disposed on the gate electrode 230. Further, the source and drain electrodes 270 and 290 contact the source and the drain regions 150 and 170, respectively, by penetrating through the interlayer insulating film 250. The source and drain electrodes 270 and 290 may each include, but is not limited to, metal, alloy, metal nitride, conductive metal oxide, or transparent conductive materials. For example, the source and drain electrodes 270 and 290 are each made of aluminum, aluminum-containing alloy, aluminum nitride, silver, silver-containing alloy, tungsten, tungsten nitride, copper, copper-containing alloy, nickel, chromium, chromium nitride, molybdenum, molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, or indium zinc oxide. These materials may be used either alone or in combination thereof. Meanwhile, the source and drain electrodes 270 and 290 may each have a single layer structure or a multilayer structure which is made of metal, alloy, metal nitride, conductive metal oxide, or transparent conductive materials, as described above. As the source and drain electrodes 270 and 290 are formed on the interlayer insulating film 250, a thin film transistor (TFT) as the switching device of the organic light emitting display 100, which includes the semiconductor patterns 150, 170, and 190, the gate insulating film 210, the gate electrode 230, the source electrode 270, and the drain electrode 290, is provided on the first substrate 110.

The first passivation film 310 is formed to cover the source and drain electrodes 270 and 290 on the interlayer insulating film 250. The first passivation film 310 may have a thickness enough to cover the source and drain electrodes 270 and 290. The first passivation film 310 may be formed of organic materials, or inorganic materials. For example, the first passivation film 310 may be made of photoresist, acrylic polymer, polyimide-based polymer, polyamide-based polymer, siloxane-based polymer, polymer including photosensitive acrylic carboxyl group, novolak resin, alkali-soluble resin, silicon oxide, silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, or titanium oxide. These materials may be used either alone or in combination thereof. Alternatively, the first passivation film 310 need not be provided depending on the constituent materials, the dimension, and the like of the insulating layer 330 subsequently formed.

The insulating layer 330 is formed on the first passivation film 310. The insulating layer 330 may be made of insulating materials. The insulating layer 330 may have a single layer structure or a multilayer structure including at least two insulating films. The insulating layer 330 includes a hole H and a recess R. The hole H partially exposes the drain electrode 290.

The recess R may be formed at the central portion of each pixel PX. When viewed from a plan view, a shape of the recess R may be rectangular. The recess R may include a bottom surface and a side. The bottom surface of the recess R may be substantially parallel with one surface of the first substrate 110. A side of the recess R may enclose the bottom surface of the recess R. An inclined angle A1 of the side of the recess R may be about 20° to about 80° with respect to an axis line substantially parallel with the first substrate 110. Alternatively, the inclined angle A1 may be about 40° to about 60°.

The first electrode 350 is formed on the recess R of the insulating layer 330. The first electrode 350 is connected to the drain electrode 290 by filling the hole H of the insulating layer 330 and is formed to extend onto the side and bottom surface of the recess R. The side portion of the first electrode 350 disposed on the recess R has an inclined angle substantially the same as or substantially similar to an inclined angle A1 of the recess R. For example, the inclined angle of the side portion of the first electrode 350 on the recess R may be about 20° to about 80° with respect to a direction substantially parallel with the first substrate 110. Alternatively, the inclined angle of the side portion of the first electrode 350 may be about 40° to about 60°.

The first electrode 350 may be formed of reflective materials. The first electrode 350 may include a reflective electrode. For example, the first electrode 350 may include metals, but is not limited to, aluminum, silver, platinum, gold (Au), chromium, tungsten, molybdenum, titanium, palladium (Pd), iridium (Ir), or an alloy thereof. These materials may be used either alone or in combination thereof. The first electrode 350 may be formed to have a single layer structure or a multilayer structure including metals and/or alloy as described above. Further, the portion of the first electrode 350 contacting the organic, light emitting layer 390 may further include, but is not limited to, indium tin oxide, indium zinc oxide, zinc tin oxide, zinc oxide, tin oxide, or gallium oxide. These materials may be used either alone or in combination thereof.

The pixel defined film 370 is formed on the insulating layer 330 and the first electrode 350. The pixel defined film 370 may be formed of organic materials, or inorganic materials. For example, the pixel defined film 370 may include organic materials, such as photoresist, polyacrylic-based resin, polyimide-based resin, or acrylic resin. The pixel defined film 370 may include inorganic materials such as a silicon compound.

The pixel defined film 370 includes an opening which exposes a portion of the first electrode 350 which is disposed on the bottom of the recess R. For example, the pixel defined film 370 is formed on a portion of a bottom surface of the recess R and on the side thereof. The pixel defined film 370 covers the side portion of the first electrode 350 which is disposed on the recess R. The side of the pixel defined film 370 defining the opening has an inclined angle substantially the same as or substantially similar to the inclined angle A1 of the recess R. For example, the inclined angle of the side of the opening of the pixel defined film 370 may be about 20° to about 80° with respect to a direction substantially horizontal to the first substrate 110. Alternatively, the inclined angle of the side of the opening of the pixel defined film 370 may be about 40° to about 60°.

Although not illustrated, a spacer for planarizing the surface of the pixel defined film 370 or controlling the overall thickness of the organic light emitting display 100 may be disposed on the pixel defined film 370. The spacer may be made of materials the same as or similar to those forming the pixel defined film 370.

The organic light emitting layer 390 is disposed on the recess R. The organic light emitting layer 390 is formed on the first electrode 350 which is exposed by the pixel defined film 370. The organic light emitting layer 390 is formed on the pixel defined film 370 covering the first electrode 350. For example, the organic light emitting layer 390 is formed on the side of the opening of the pixel defined film 370. The bottom surface of the organic light emitting layer 390 is disposed on the first electrode 350 and the side portion of the organic light emitting layer 390 is disposed on the pixel defined film 370. Therefore, the side portion of the organic light emitting layer 390 has an inclined angle substantially the same as or substantially similar to the inclined angle A1 of the recess R. For example, the inclined angle of the side portion of the organic light emitting layer 390 may be about 20° to about 80° with respect to an axis line substantially horizontal to the first substrate 110. Alternatively, the inclined angle of the side portion of the organic light emitting layer 390 may be about 40° to about 60°, The organic light emitting layer 390 may have a multi-layer structure including a light emitting layer (EL), a hole injection layer (HIL), a hole transport layer (HTL), an electron transport layer (ETL), or an electron injection layer (ETL). The organic light emitting layer 390 may be formed of light emitting materials which generate different color light, such as red light, green light, and blue light, depending on each pixel Px of the organic light emitting display 100. Alternatively, the organic light emitting layer 390 may include a multilayer structure emitting white light by stacking the plurality of light emitting materials emitting different color light, such as red light, green light, and blue light. The organic light emitting layer 390 may further include a host material having substantially a larger band gap over the light emitting materials.

The second electrode 410 is formed on the organic light emitting layer 390 and the pixel defined film 370 with a uniform thickness. The second electrode 410 is formed over the surface of the organic light emitting layer 390 and the pixel defined film 370. The second electrode 410 includes a first opening 410a exposing at least a portion of the organic light emitting layer 390. The first opening 410a exposes an edge portion of the organic light emitting layer 390. The exposed edge portion of the organic light emitting layer 390 is disposed on the side of the recess R.

The first opening 410a of the second electrode 410 may have a quadrangular ring shape when viewed from a plan view. The second electrode 410 includes a first portion 410b enclosed by the first opening 410a and a second portion 410c disposed at an outer side of the first opening 410a. As shown in FIG. 1, the first portion 410b of the second electrode 410 is electrically connected to the second portion 410c of the second electrode 410 using a bridge B, as shown in FIG. 1.

The first portion of the second electrode 410 is disposed on the recess R of the insulating layer 330, and thus the first portion of the second electrode 410 has an inclined angle substantially the same as or substantially similar to the inclined angle A1 of the side of the recess R of the insulating layer 330. For example, the inclined angle of the side portion of the second electrode 410 disposed on the organic light emitting layer 390 may be about 20° to about 80° with respect to the axis line substantially parallel with the first substrate 110. Alternatively, the inclined angle of the side portion of the second electrode 410 disposed on the organic light emitting layer 390 may be about 40° to about 60°.

The second electrode 410 may be formed of reflective materials including metals, such as aluminum, silver, platinum, gold (Au), chromium, tungsten, molybdenum, titanium, palladium (Pd), iridium (Ir), or an alloy thereof. These materials may be used either alone or in combination thereof. The second electrode 410 may be formed of a single layer structure or a multilayer structure including metals and/or alloy as described above. The second electrode 410 may be made of substantially the same materials as those forming the first electrode 350 but is not limited thereto, and may be made of materials different therefrom.

The first electrode 350 and the second electrode 410 are reflective. The first and second electrodes 350 and 410 reflect light emitted from a portion of the organic light emitting layer 390. The portion of the organic light emitting layer 390 is interposed between the first electrode 350 and the second electrode 410, which are disposed at the central portion of the pixel Px. The light does not pass through the first and second electrodes 350 and 410. At the central portion of the pixel Px, the first electrode 350, the second electrode 410, and the organic light emitting layer 390 are disposed in parallel with the first substrate 110. This parallel structure serves to guide the light to the first opening 410a through reflection of the first and second electrodes 350 and 410. For example, the light is propagated in parallel with the first substrate 110. The propagated light is reflected by the first electrode 350 having a predetermined inclined angle thereby being emitted to a front surface of the first substrate 110.

The emitted light passes through the first opening 410a of the second electrode 410. The first opening 410a may be referred to as a passing region P. The light emitted to the front surface of the first substrate 110 is emitted in a radial type, and therefore the luminescent region E is wider than the passing region P. For example, a portion of the luminescent region E overlaps the passing region P and the whole of the passing region P overlaps the luminescent region E.

The inclined angle of the organic light emitting layer 390, the first electrode 350 and the second electrode 410 may prevents total reflection of the light emitted from the organic light emitting layer 390 from occurring, thereby securing light efficiency increased as much as at least about 30% or more, as compared with an organic light emitting display having total reflection.

Further, the first and second electrodes 350 and 410 are reflective, thereby removing the problem of IR drop due to the use of transparent electrodes by using the low-resistance reflective electrode.

The organic light emitting display 100 may secure increased side visibility without using an optical resonance of light generated from the organic light emitting layer 390. Accordingly, the number of process steps for forming the organic light emitting display 100 may be reduced.

The second passivation film 430 is formed on the second electrode 410 and the organic light emitting layer 390. The second passivation film 430 may be formed of organic materials, or inorganic materials. For example, the second passivation film 430 may include photoresist, acrylic polymer, polyimide-based polymer, polyamide-based polymer, siloxane-based polymer, polymer including photosensitive acrylic carboxyl group, novolak resin, alkali-soluble resin, silicon oxide, silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, or titanium oxide. These materials may be used either alone or in combination thereof.

The light absorbing layer 450 is disposed on the second electrode 410. The light absorbing layer 450 may include, but is not limited to, a black matrix. For example, the light absorbing layer 450 may include material layers absorbing light. The light absorbing layer 450 substantially overlaps the second electrode 410. For example, the light absorbing layer 450 is disposed at the central portion of the pixel Px and an edge portion of the pixel Px.

The light absorbing layer 450 includes a second opening 450a. The second opening 450a encloses the organic light emitting layer 390 which is in contact with the first electrode 350 and the second electrode 410. When viewed from a plan view as shown in FIG. 1, the second opening 450a has a quadrangular ring shape. The second opening 450a is larger than the first opening 410a. For example, at least a portion of the second opening 450a overlaps the first opening 410a. A portion of the second opening 450a overlaps the first opening 410a and the whole of the first opening 410a overlaps the second opening 450a. The light reflected from the first electrode 350 and emitted toward the front surface of the first substrate 110 passes through the first opening 410a and then the second opening 450a.

The light absorbing layer 450 defines the luminescent region E. Light incident on a region in which the light absorbing layer 450 is formed is absorbed by the light absorbing layer 450, and therefore the region in which the light absorbing layer 450 is formed is the non-luminescent region N. Light incident on a region in which the light absorbing layer 450 is not formed is not absorbed by the light absorbing layer 450, and therefore the region in which the light absorbing layer 450 is not formed is the luminescent region E. For example, the region in which the second opening 450a is formed is the luminescent region E.

The front surface of the organic light emitting display 100 includes light absorbing layer 450 having the second opening 450a, thereby improving external light visibility. For example, most of the light incident from the outside of the organic light emitting display 100 to the organic light emitting display 100 is absorbed by the light absorbing layer 450 to minimize the external light reflection, thereby improving the external light visibility. The external light reflection is blocked by minimizing the exposure of the reflective electrode.

The pixel structure according to an exemplary embodiment may increase external light visibility without additional structures such as a circularly polarizing plate, a color filter, or a destructive interference structure. Such additional structures may absorb 50% to 55% of light emitted from the organic light emitting structure. Forming of the color filter is performed using a low-temperature process of 100° C. or less, thereby causing many problems in reliability. Accordingly, the pixel structure according to an exemplary embodiment may reduce manufacturing costs and substantially increase light efficiency.

The adhesive layer 470 is formed on the second passivation film 430 and the light absorbing layer 450. The adhesive layer 470 may be formed of a transparent material including curable resin, such as acryl and epoxy. The adhesive layer 470 is formed both on the second passivation film 430 and the light absorbing layer 450. A seal pattern is formed on the edge of the first substrate 110 to bond the first substrate 110 to the second substrate 490 to be described below. In this case, the adhesive layer 470 may be omitted.

The second substrate 490 is disposed on the adhesive layer 470. The second substrate 490 may include a transparent insulating substrate including, but is not limited to, glass, transparent plastic, or transparent ceramics. The second substrate 490 may be made of materials that is substantially the same as or substantially similar to those forming the first substrate 110.

Figure 3:
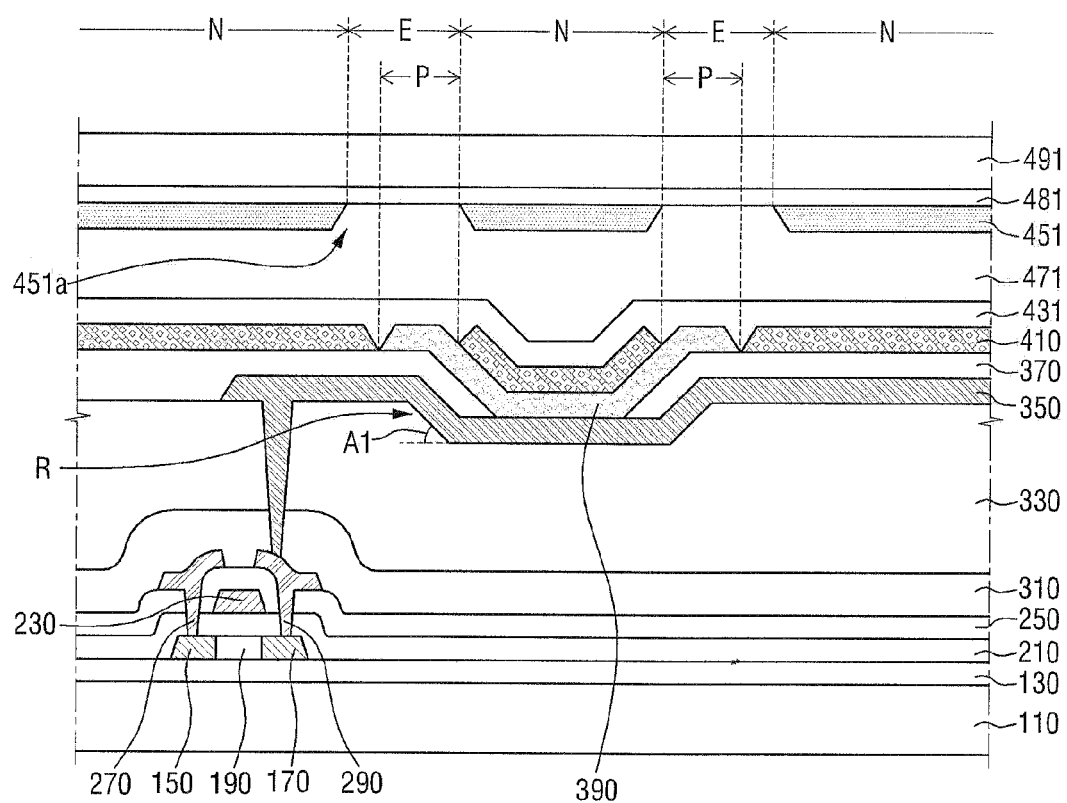
FIG. 3 is a cross-sectional view of an organic light emitting display according to an exemplary embodiment of the present invention.

FIG. 3 is a cross-sectional view of an organic light emitting display 101 according to an exemplary embodiment of the present invention. The organic light emitting display 101 is substantially similar to that of FIG. 2, except for a light absorbing layer 451. For the convenience of description, substantially the same elements as those illustrated in FIG. 2 are denoted by the same reference numerals and the overlapping description thereof will be omitted.

Referring to FIG. 3, the light absorbing layer 451 is formed under a second substrate 491, without contacting a second passivation film 431. For example, the light absorbing layer 451 is interposed between an adhesive layer 471 and the second substrate 491. The light absorbing layer 451 is manufactured along with the second substrate 491 and then may be bonded to the first substrate 110. A diffusion barrier layer 481 is formed between the light absorbing layer 451 and the second substrate 491. The diffusion barrier layer 481 may prevent the second substrate 491 from being contaminated due to the diffusion of materials included in the light absorbing layer 451 toward the second electrode 491 or the light absorbing layer 451 from being contaminated due to the diffusion of materials included in the second substrate 491 toward the light absorbing layer 451. The diffusion barrier layer 481 may be made of materials that is substantially the same as or substantially similar to those forming the above-mentioned buffer layer 130. The light absorbing layer 451 includes a second opening 451a, and a size of the second opening 451a is larger than or substantially equal to that of second opening 451a of the organic light emitting display 100.

The light absorbing layer 451 may be formed in a single plane, thereby facilitating to define the luminescent region E in the light absorbing layer 451.

Figure 4:
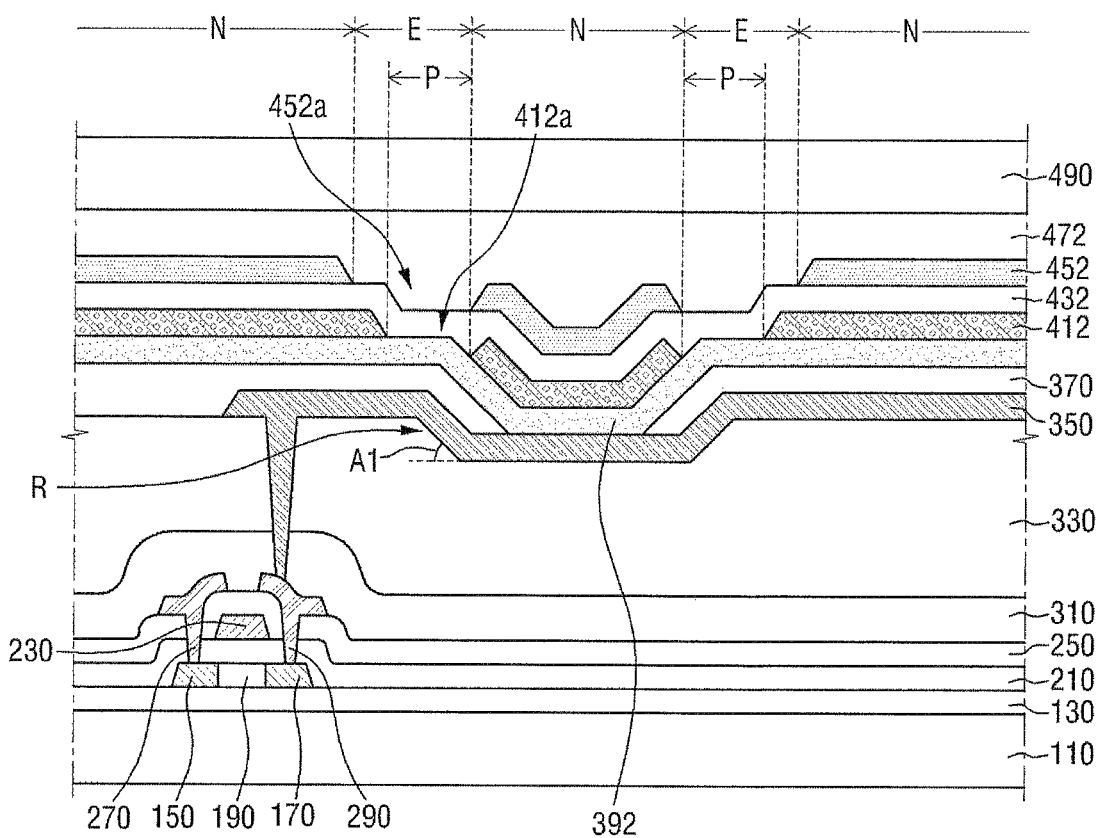
FIG. 4 is a cross-sectional view of an organic light emitting display according to an exemplary embodiment of the present invention.

FIG. 4 is a cross-sectional view of an organic light emitting display 102 according to an exemplary embodiment of the present invention. The organic light emitting display 102 is substantially similar to that of FIG. 1, except for a first opening 412a, a second opening 452a, and an organic light emitting layer 392. For the convenience of description, substantially the same elements as those illustrated in FIG. 2 are denoted by the same reference numerals and the overlapping description thereof will be omitted.

Referring to FIG. 4, the organic light emitting layer 392 is formed at not only the central portion of the pixel Px but also the edge portion of the pixel Px. As such, a shape of a second electrode 412 including a first opening 412a, a second passivation film 432, a light absorbing layer 452 including a second opening 452a, and an adhesive layer 472 may be changed.

The organic light emitting layer 392 may be formed without using a fine metal mask (FMM). For example, an open mask may be used in forming the organic light emitting layer 392, thereby increasing process efficiency.

Figure 5:
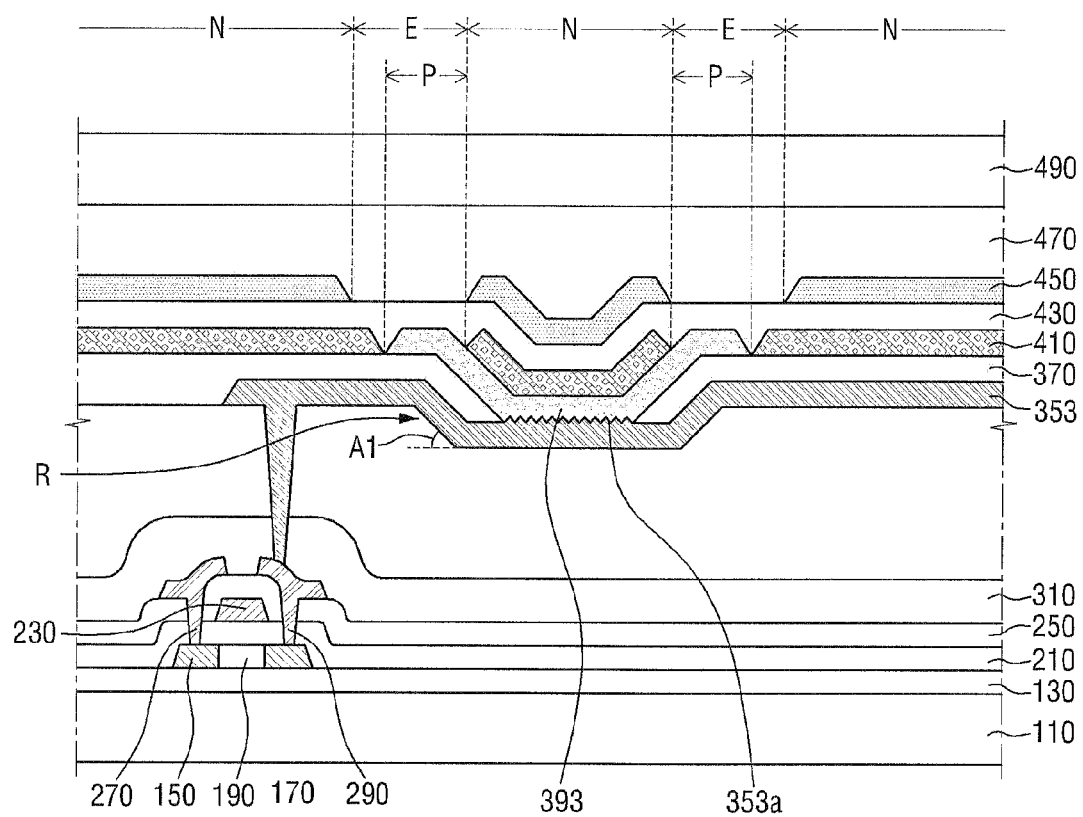
FIG. 5 is a cross-sectional view of an organic light emitting display according to an exemplary embodiment of the present invention.

FIG. 5 is a cross-sectional view of an organic light emitting display 103 according to an exemplary embodiment of the present invention. The organic light emitting display 103 is substantially similar to that of FIG. 2, except for a rugged part 353a of a first electrode 353. For the convenience of description, substantially the same elements as those illustrated in FIG. 2 are denoted by the same reference numerals and the description thereof will be omitted.

Referring to FIG. 5, the rugged part 353a is formed on a surface of the first electrode 353 which contacts an organic light emitting layer 393. The surface of the first electrode 353 may be processed so that the surface has the rugged part 353a. The first electrode 353 is disposed on a bottom surface of the recess R immediately after the first electrode 353 is formed. Alternatively, a separate scattering pattern may be formed on one surface of the first electrode 353 which contacts the organic light emitting layer 393.

The rugged part 353a of the first electrode 353 prevents light vertically emitted from the organic light emitting layer 393 from being trapped between the first electrode 353 and the second electrode 410. For example, the rugged part 353a may scatter the light vertically emitted from the organic light emitting layer 393, thereby the light propagating to the outside the pixel Px.

Figure 6:
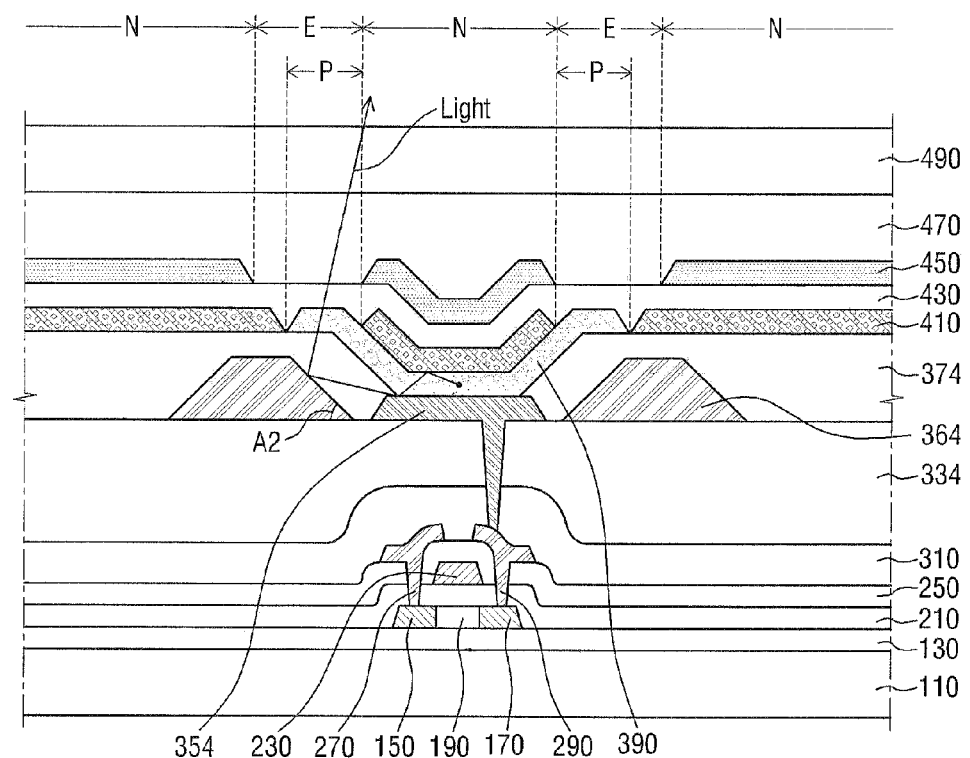
FIG. 6 is a cross-sectional view of an organic light emitting display according to an exemplary embodiment of the present invention.

FIG. 6 is a cross-sectional view of an organic light emitting display 104 according to an exemplary embodiment of the present invention. The organic light emitting display 104 is substantially similar to that of FIG. 2, except for a reflective barrier rib 364 and an insulating layer 334. For the convenience of description, substantially the same elements as those illustrated in FIG. 2 are denoted by the same reference numerals and the description thereof will be omitted.

Referring to FIG. 6, the insulating layer 334 is flat without a recessed region. For example, unlike the organic light emitting display device 100 of FIG. 2, the insulating layer 334 of FIG. 6 does not include a recessed region such as the recess R of FIG. 2. For example, the insulating layer 334 includes a flat surface facing a pixel defined film 374 and a first electrode 354. The organic light emitting display 104 includes the reflective barrier rib 364 enclosing an organic light emitting layer 390 which is in contact with the first electrode 354 and the second electrode 410.

The reflective barrier rib 364 is reflective. The reflective barrier rib 364 may include reflective materials that are substantially the same as or substantially similar to those forming the first electrode 354 and the second electrode 410. The reflective barrier rib 364 is spaced apart from the first electrode 354 and the second electrode 410 at a predetermined distance to enclose the first electrode 354. For example, the reflective barrier rib 364 is covered with the pixel defined film 374. The pixel defined film 374 serves to electrically isolate the reflective barrier rib 364 from the first electrode 354 or the second electrode 410.

The reflective barrier rib 364 has an inclined side at an angle A2 with respect to the axis line substantially horizontal to the first substrate. For example, the inclined angle A2 may be substantially the same as or substantially similar to the inclined angle A1. For example, the inclined angle A2 of the side of the reflective barrier rib 364 may be about 20° to about 70° with respect to the axis line substantially horizontal to the first substrate 110. Alternatively, the inclined angle A2 may be about 40° to about 60°.

Light propagated in a direction parallel with the first substrate 110 may be guided toward the front surface of the first substrate 110 using the separate reflective barrier rib 364 spaced apart from the first electrode 354 and the second electrode 410.

Figure 7:
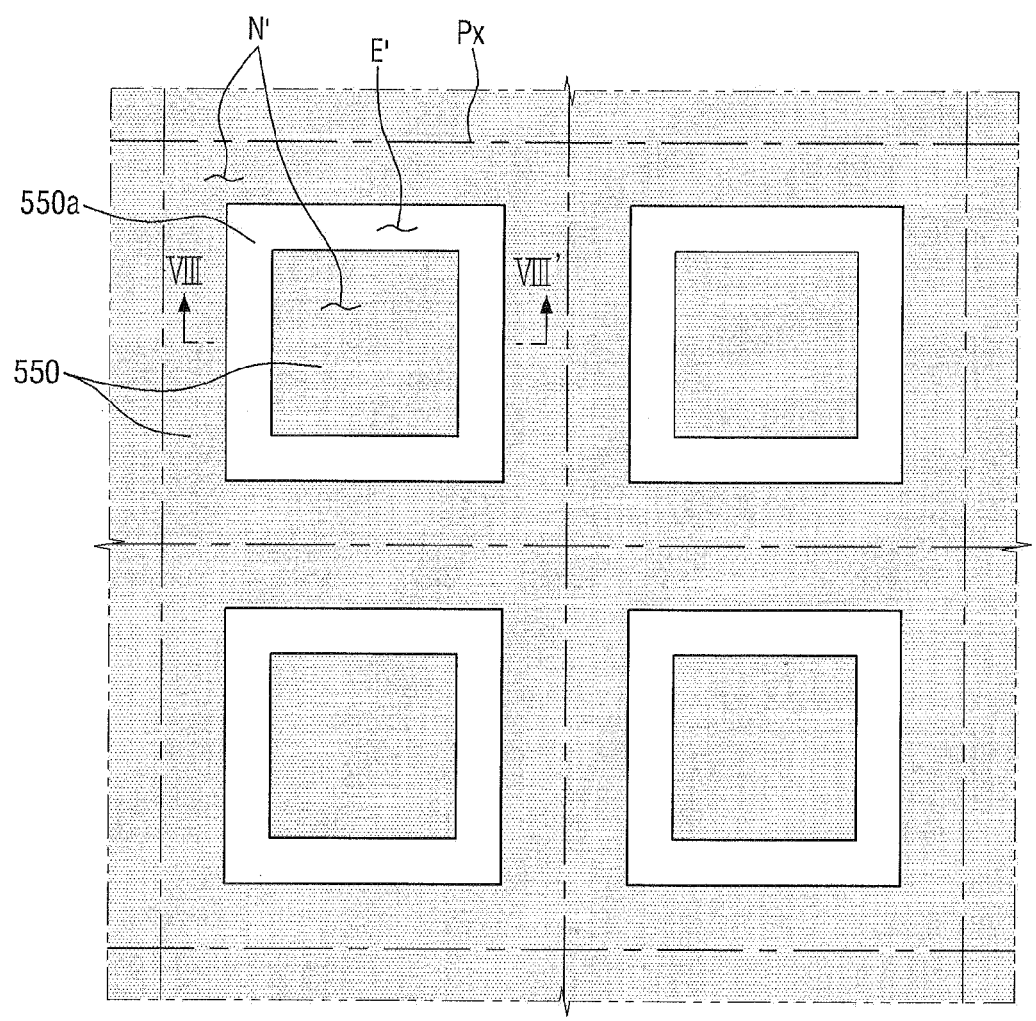
FIG. 7 is a plan view of an organic light emitting display according to an exemplary embodiment of the present invention.
Figure 8:
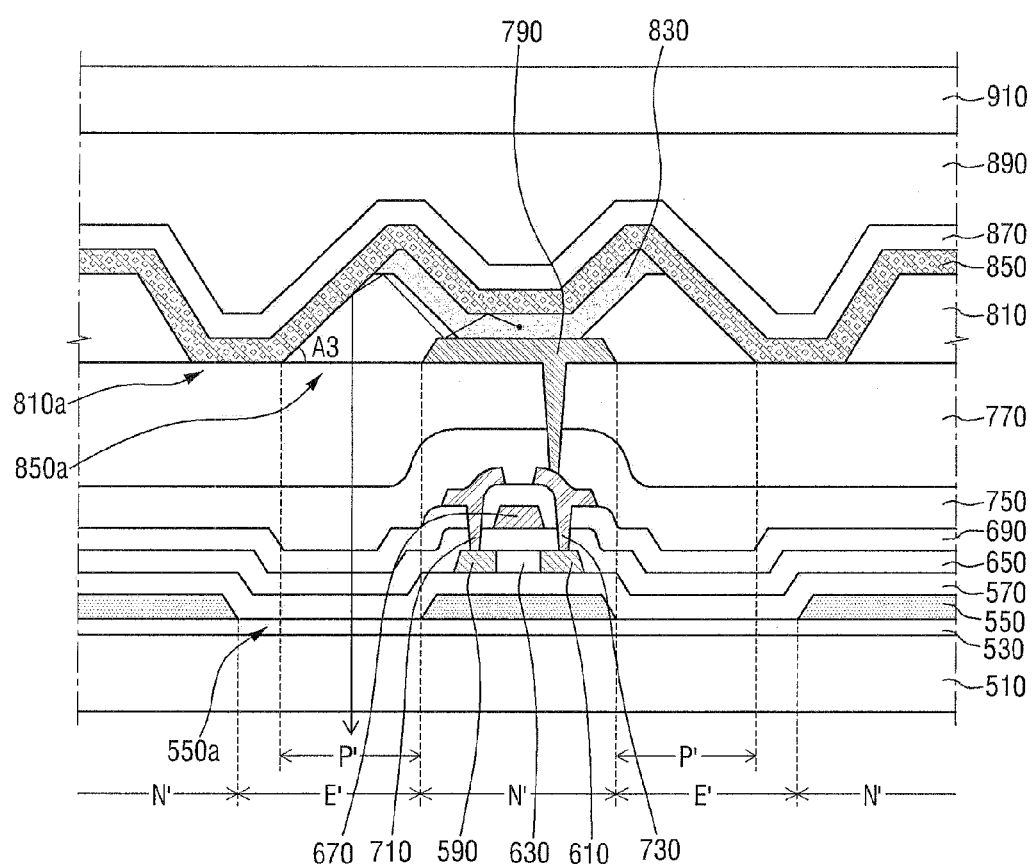
FIG. 8 is a cross-sectional view of the organic light emitting display taken along line VIII-VIII' of FIG. 7.

FIG. 7 is a plan view of an organic light emitting display 500 according to an exemplary embodiment of the present invention. FIG. 8 is a cross-sectional view of the organic light emitting display taken along line VIII-VIII' of FIG. 7. For the convenience of description, substantially the same elements as those illustrated in FIGS. 1 and 2 will not be repeatedly described. Differences from the organic light emitting display 100 of FIGS. 1 and 2 will be mainly described.

Referring to FIGS. 7 and 8, the organic light emitting display 500 is a bottom emission type display. The organic light emitting display 500 includes a first substrate 510, a diffusion barrier layer 530, a light absorbing layer 550, semiconductor patterns (including a buffer layer 570, a source region 590, the drain region 610, and the channel region 630), a gate insulating film 650, a gate electrode 670, an interlayer insulating film 690, a source electrode 710, a drain electrode 730, a first passivation film 750, an insulating layer 770, a first electrode 790, a pixel defined film 810, an organic light emitting layer 830, a second electrode 850, a second passivation film 870, an adhesive layer 890, and a second substrate 910. The order listed as described above may be a stacked order in manufacturing the organic light emitting display 500 according to an exemplary embodiment of the present invention.

The insulating layer 770 includes a flat surface facing the pixel defined film 810 and the first electrode 790.

The first electrode 790 is disposed on the flat insulating layer 770. The first electrode 790 may be formed at the central portion of the pixel Px.

The pixel defined film 810 is formed at the edge portion of the first electrode 790 and on the insulating layer 770. The pixel defined film 810 includes a third opening 810a. The third opening 810a is adjacent to the first electrode 790. The third opening 810a is spaced apart from the first electrode 790 to enclose the first electrode 790. When viewed from a plan view, the third opening 810a may have a quadrangular ring shape defined by the pixel defined film 810. The pixel defined film 810 includes an inclined side having an angle A3 with respect to the flat surface of the insulating layer 770. For example, the inclined angle A3 may be about 20° to about 70° with respect to the flat surface of the insulating layer 770. Alternatively, the inclined angle A3 may be about 40° to about 60°.

The second electrode 850 is formed on the organic light emitting layer 830, the pixel defined film 810, and the insulating layer 770. For example, the second electrode 850 covers the third opening 810a. Therefore, the second electrode 850 is formed on the inclined side of the pixel defined film 810. The inclined angle of the second electrode 850 formed on the side of the third opening 810a may be substantially the same as or substantially similar to the inclined angle A3 of the inclined side of the pixel defined film 810. For example, the inclined angle of the second electrode 850 formed on the side of the third opening 810a may be about 20° to about 80° with respect to the flat surface of the insulating layer 770. Alternatively, the inclined angle of the second electrode 850 formed on the side of the third opening 810a may be about 40° to about 60°.

The first electrode 790 and the second electrode 850 form a first opening 850a. For example, a portion enclosed by the first electrode 790 and the second electrode 850 form the first opening 850a. When viewed from a plan view, the first opening 850a may have a quadrangular ring shape.

Both of the first electrode 790 and the second electrode 850 are reflective. For example, the first and second electrodes 790 and 850 may include a reflective electrode. Therefore, light emitted from the organic light emitting layer 830 interposed between the first electrode 790 and the second electrode 850 is reflected from the first and second electrodes 790 and 850, being propagated in parallel with the first substrate 510. The reflected light passes through the first opening 850a, being emitted through a rear surface of the first substrate 510.

A portion of a luminescent region E' overlaps a passing region P' and the whole of the passing region P' overlaps the luminescent region E'. A non-luminescent region N' need not overlap the passing region P'.

Such pixel structure having the inclined side portion of the second electrode 850 serves to prevent total reflection of the light emitted from the organic light emitting layer 830, thereby securing light efficiency increased as much as at least about 30% or more, as compared with an organic light emitting display having total reflection. The first and second electrodes 790 and 850 are reflective, thereby eliminating the problem of IR drop. The pixel structure of FIG. 8 secures increased side visibility, without using an optical resonance structure.

The light absorbing layer 550 is interposed between the first substrate 510 and the buffer layer 570. The light absorbing layer 550 may be a black matrix, but is not limited thereto. The light absorbing layer 550 may include a second opening 550a. When viewed from a plan view, the second opening 550a may have a quadrangular ring shape. The light emitted from the organic light emitting layer 830 passes through the first opening 850a and the second opening 550a to be emitted toward the rear surface of the first substrate 510.

The diffusion barrier layer 530 is interposed between the light absorbing layer and the first substrate 510. The diffusion barrier layer 530 may serve to prevent the diffusion phenomenon from occurring between the light absorbing layer 550 and the first substrate 510.

The rear surface of the organic light emitting display 500 includes the light absorbing layer 550 having the second opening 550a, thereby increasing external light visibility. For example, the organic light emitting display 500 does not include a circularly polarizing plate, a color filter, or a destructive interference structure to increase external light visibility. Accordingly, the manufacturing costs may be reduced, and the light efficiency of the organic light emitting display 500 may be increased. The external light reflection may be blocked by minimizing the exposure of the reflective electrode, which contributes to the external light reflection.

Figure 9:
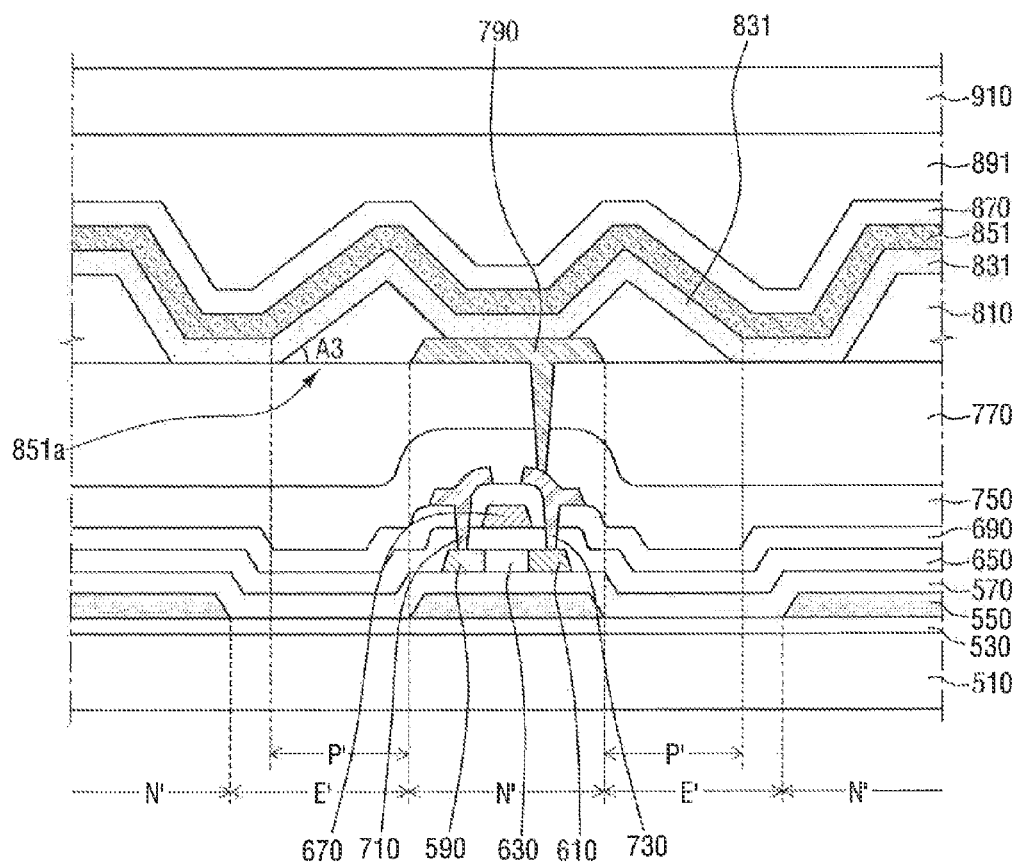
FIG. 9 is a cross-sectional view of an organic light emitting display according to an exemplary embodiment of the present invention.

FIG. 9 is a cross-sectional view of an organic light emitting display 501 according to an exemplary embodiment of the present invention. For the convenience of description, substantially the same elements as those illustrated in FIG. 8 are denoted by the same reference numerals and the description thereof will be omitted.

Referring to FIG. 9, an organic light emitting layer 831 is formed at not only the central portion of the pixel Px but also the edge portion of the pixel Px. A shape of a first opening 851a, a second electrode 851, a second passivation film 870, and an adhesive layer 891 may be changed.

The organic light emitting layer 831 may be formed without using a fine metal mask (FMM). An open mask may be used, thereby increasing process efficiency.

Figure 10:
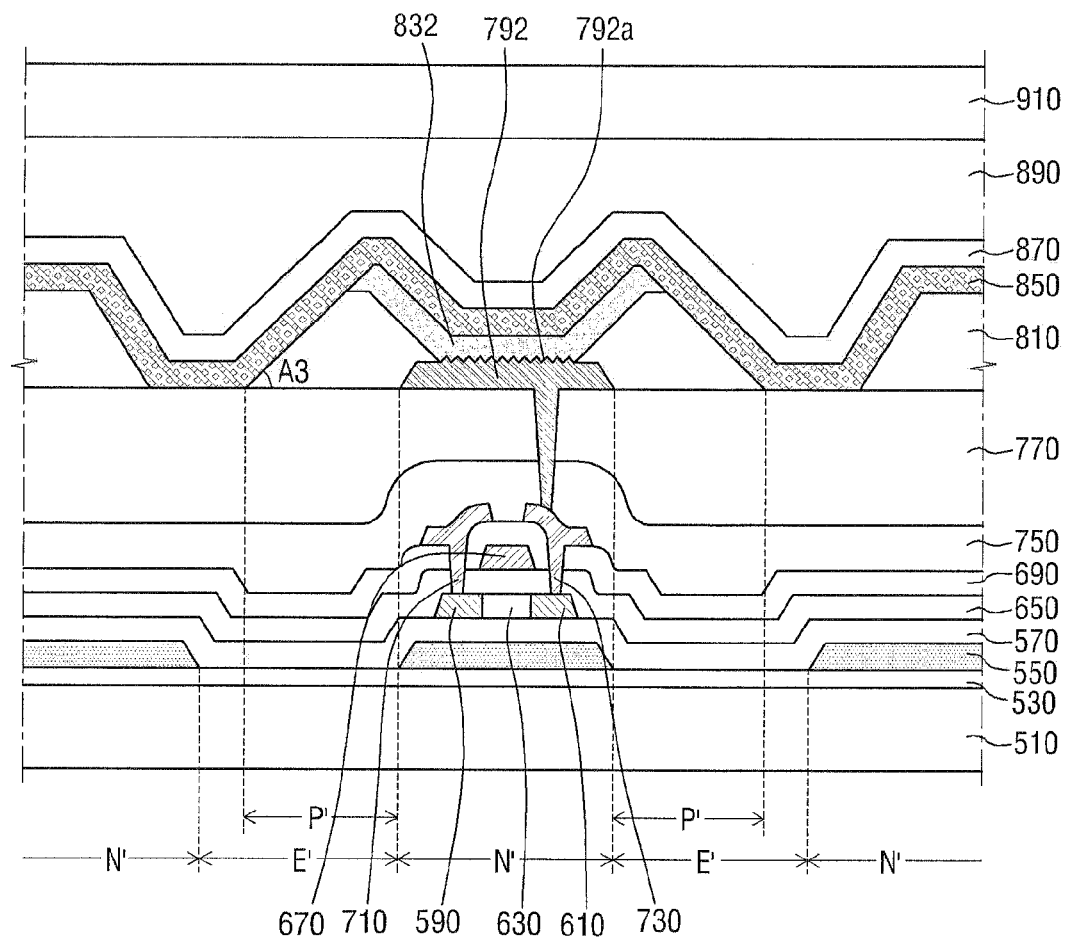
FIG. 10 is a cross-sectional view of an organic light emitting display according to an exemplary embodiment of the present invention.

FIG. 10 is a cross-sectional view of an organic light emitting display 502 according to an exemplary embodiment of the present invention. For the convenience of description, substantially the same elements as those illustrated in FIG. 8 are denoted by the same reference numerals and the description thereof will be omitted.

Referring to FIG. 10, a first electrode 792 includes a rugged part 792a facing an organic light emitting layer 832. Alternatively, a separate scattering pattern may be disposed on the first electrode 792, facing the organic light emitting layer 832.

The rugged part 792a scatters light vertically emitted from the organic light emitting layer 832. Accordingly, the rugged part may prevent the light vertically emitted from the organic light emitting layer 832 from being trapped between the first electrode 792 and the second electrode 850.

Figure 11:
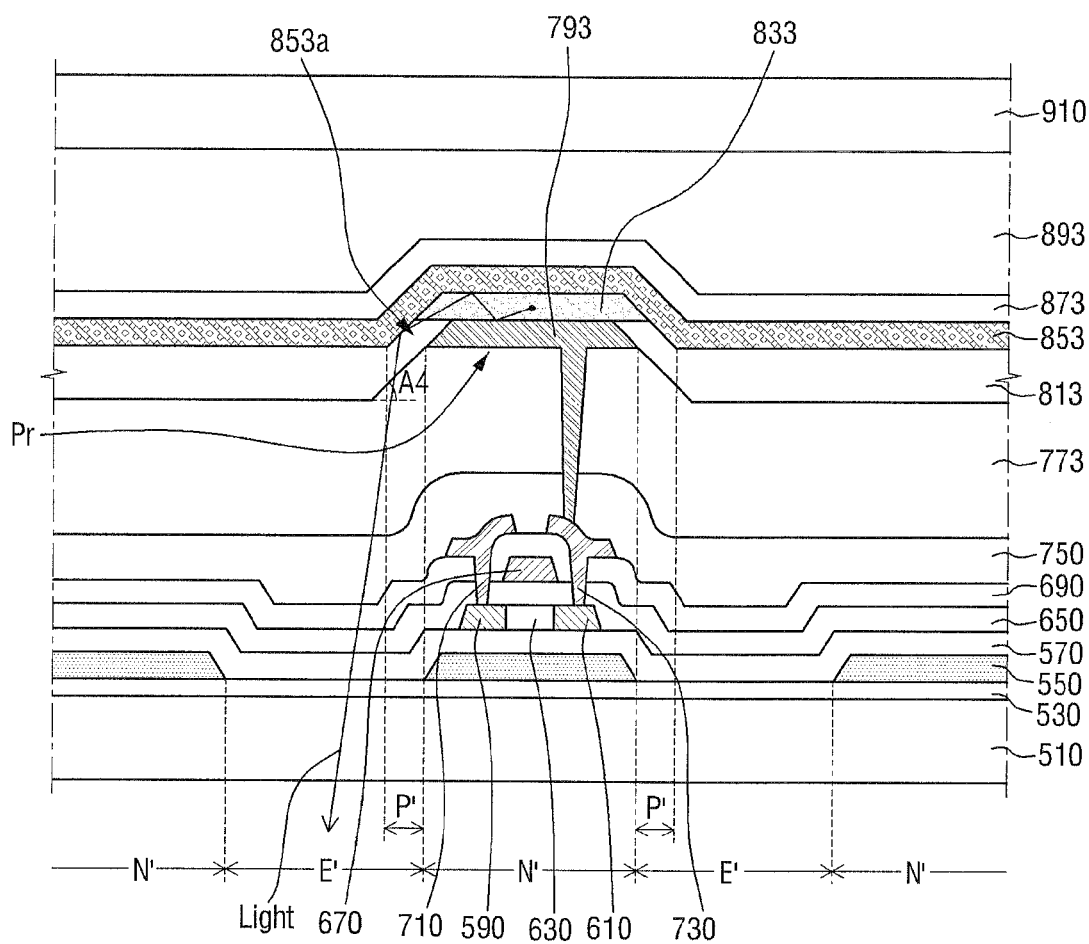
FIG. 11 is a cross-sectional view of an organic light emitting display according to an exemplary embodiment of the present invention.

FIG. 11 is a cross-sectional view of an organic light emitting display 503 according to an exemplary embodiment of the present invention. For the convenience of description, substantially the same elements as those illustrated in FIG. 8 are denoted by the same reference numerals and the description thereof will be omitted.

Referring to FIG. 11, an insulating layer 773 includes a protrusion Pr. The protrusion Pr protrudes toward the front surface of the first substrate 510. For example, the protrusion Pr protrudes toward the organic light emitting layer 833. Each protrusion Pr is formed at the central portion of each pixel PX. When viewed from a plan view, a shape of the protrusion Pr may be a rectangle. The protrusion Pr includes an upper surface and a side. The upper surface of the protrusion Pr is substantially parallel with one surface of the first substrate 510. The side of the protrusion Pr encloses the upper surface of the protrusion Pr. An inclined angle A4 of the side of the protrusion Pr may be about 20° to about 80° with respect to an axis line substantially parallel with the first substrate 510. Alternatively, the inclined angle A4 of the side of the protrusion Pr may be about 40° to about 60°.

A first electrode 793 is formed on the protrusion Pr of the insulating layer 773. The first electrode 793 covers the upper surface of the protrusion Pr.

A pixel defined film 813 covers a side of the insulating layer 773 and a side of the first electrode 793. For example, the pixel defined film 813 is formed on one surface of the insulating layer 773 parallel with the first substrate 510, the side of the protrusion Pr, and the side of the first electrode 793. The pixel defined film 813 exposes an upper surface of the first electrode 793, covering the insulating layer 773. Further, a height of the pixel defined film 813 may be equal to or smaller than that of the protrusion Pr. Further, the pixel defined film 813 disposed on the side of the protrusion Pr has an inclined angle that is substantially the same as or substantially similar to the inclined angle A4 of the side of the protrusion Pr. For example, the inclined angle of the pixel defined film 813 on the side of the protrusion Pr may be about 20° to about 80° with respect to a direction substantially parallel to the first substrate 510. Alternatively, the inclined angle of the pixel defined film 813 on the side of the protrusion Pr may be about 40° to about 60°.

The organic light emitting layer 833 is formed on the pixel defined film 813 and the first electrode 793.

A second electrode 853 is formed on the pixel defined film 813 and the organic light emitting layer 833. The second electrode 853 may have a substantially uniform thickness. The second electrode 853 defines a first opening 853a, along with the first electrode 793. An inclined side of the second electrode 853, which contacts the side of the organic light emitting layer 833 and the side of the pixel defined film 813, has an angle that is substantially the same as or similar to the inclined angle A4 of the side of the protrusion Pr. For example, the second electrode 853 has an inclined angle having about 20° to about 80° with respect to a direction substantially parallel to the first substrate 510. Alternatively, the inclined angle of the second electrode 853 may be about 40° to about 60°.

A second passivation film 873 and an adhesive layer 893 are conformally formed on the second electrode 853.

As such, the organic light emitting display 503 may have various structure, by patterning the insulating layer 773 in various shapes, thereby obtaining the bottom emission type organic light emitting display 503 having high light efficiency.

Figure 12:
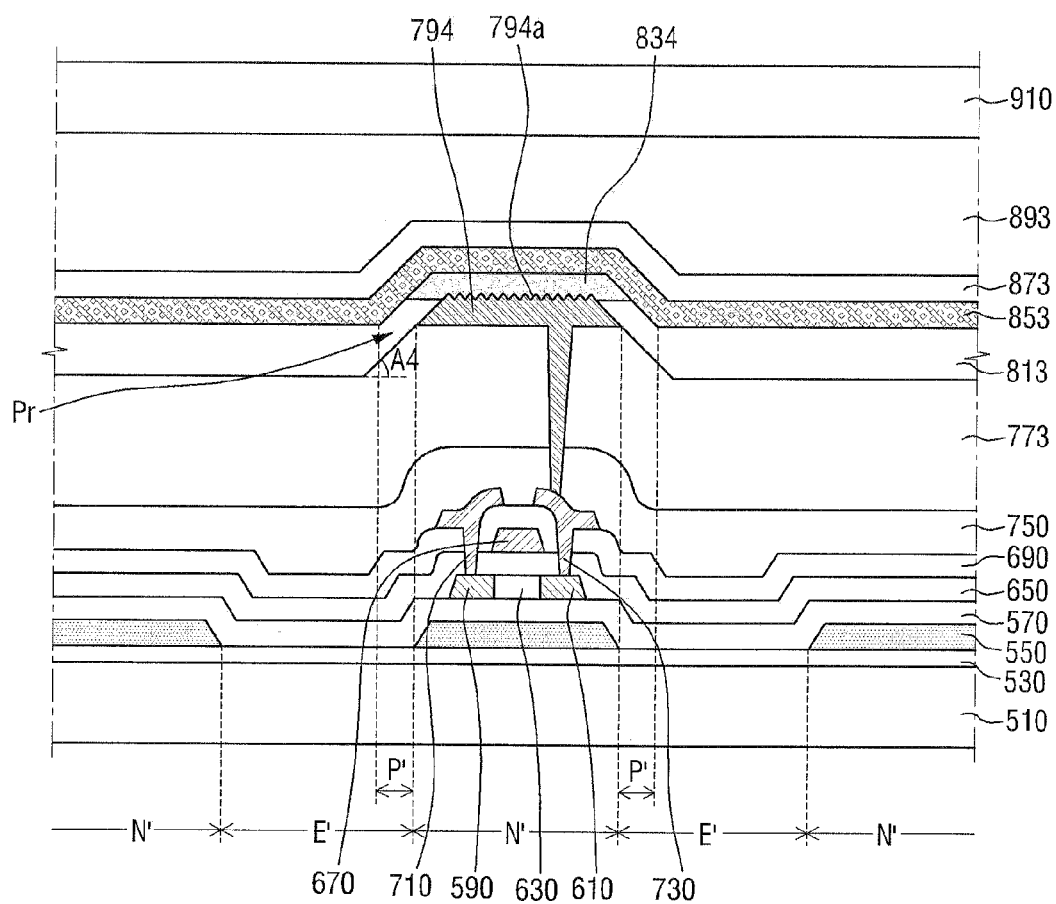
FIG. 12 is a cross-sectional view of an organic light emitting display according to an exemplary embodiment of the present invention.

FIG. 12 is a cross-sectional view of an organic light emitting display 504 according to another exemplary embodiment of the present invention. For convenience of explanation, substantially the same elements as each element illustrated in FIG. 11 are denoted by the same reference numerals and the overlapping description thereof will be omitted.

Referring to FIG. 12, a rugged part 794a is formed on one surface of a first electrode 794 which contacts an organic light emitting layer 834. As another example, a separate scattering pattern may also be formed on one surface of the first electrode 794 which contacts the organic light emitting layer 834.

As such, the rugged part 794a prevents light vertically emitted from the organic light emitting layer 834 from being trapped between the first electrode 794 and the second electrode 853.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. An organic light emitting display, comprising:
    a first substrate;
    a first electrode disposed on the first substrate;
    a second electrode disposed on the first electrode;
    a second substrate disposed on the second electrode; and
    an organic light emitting layer interposed between the first electrode and the second electrode,
    wherein the first electrode and the second electrode are reflective,
    wherein the second electrode includes a first opening passing through the second electrode,
    wherein a first reflective surface of the first electrode and a second reflective surface of the second electrode are configured to guide light emitted from the organic light emitting layer to the first opening,
    wherein a portion of the organic light emitting layer is disposed within the first opening and the light passes through the organic light emitting layer disposed within the first opening,
    wherein the portion of the organic light emitting layer partially fills the first opening, and
    wherein the organic light emitting layer is in direct contact with the first electrode and the second electrode.

2. The organic light emitting display of claim 1, further comprising:
    an insulating layer interposed between the first substrate and the first electrode, the insulating layer including a recess,
    wherein the first electrode, the second electrode, and the organic light emitting layer are formed on the recess.

3. The organic light emitting display of claim 2,
    wherein the first electrode is formed on a side of the recess, the first electrode guiding the light to the second substrate through the first opening.

4. The organic light emitting display of claim 1, further comprising:
    an insulating layer interposed between the first substrate and the first electrode, a reflective barrier rib disposed on the insulating layer and enclosing the organic light emitting layer that is contact with the first electrode and the second electrode, wherein the reflective barrier rib guides the light toward the second substrate through the first opening.

5. The organic light emitting display of claim 1, further comprising:
    a light absorbing layer disposed on the second electrode, wherein the light absorbing layer includes a second opening disposed on the first opening.

6. The organic light emitting display of claim 5,
    wherein the light absorbing layer includes a black matrix.

7. The organic light emitting display of claim 5,
    wherein the second opening encloses the organic light emitting layer that is in contact with the first electrode and the second electrode.

8. The organic light emitting display of claim 1, further comprising:
    an insulating layer interposed between the first substrate and the first electrode;
    a pixel defined film disposed on the insulating layer and the first electrode,
    wherein the pixel defined film includes a third opening exposing a part of the first electrode, wherein the second electrode is disposed on the third opening.

9. The organic light emitting display of claim 8,
    wherein the second electrode formed on an inclined side of the pixel defined film guides the light toward the first substrate.

10. The organic light emitting display of claim 1, further comprising:
    an insulating layer interposed between the first substrate and the first electrode, the insulating layer including a protrusion toward the second substrate, wherein the first electrode, the second electrode, and the organic light emitting layer are formed on the protrusion.

11. The organic light emitting display of claim 10,
    wherein the second electrode formed on a side of the protrusion guides the light toward the first substrate.

12. The organic light emitting display of claim 1,
    wherein the first electrode includes a rugged surface, the rugged surface facing the organic light emitting layer.

13. An organic light emitting display, comprising:
    a first substrate;
    a first electrode disposed on the first substrate;
    a second electrode disposed on the first electrode;
    a second substrate disposed on the second electrode; and
    an organic light emitting layer interposed between the first electrode and the second electrode,
    wherein the first electrode and the second electrode are reflective, and the second electrode includes a first opening passing through the second electrode and exposing a portion of the organic light emitting layer,
    wherein the portion of the organic light emitting layer is disposed within the first opening and the light passes through the organic light emitting layer disposed within the first opening,
    wherein the portion of the organic light emitting layer partially fills the first opening, and
    wherein the organic light emitting layer is in direct contact with the first electrode and the second electrode.

14. The organic light emitting display of claim 13,
    wherein the first electrode includes an inclined side configured to guide light emitted from the organic light emitting layer to the second substrate through the first opening.

15. The organic light emitting display of claim 13, further comprising: a light absorbing layer disposed on the second electrode, wherein the light absorbing layer includes a second opening disposed on the first opening, wherein the light passes through the second opening.

16. An organic light emitting display, comprising:
    a first substrate;
    a light absorbing layer disposed on the first substrate, wherein the light absorbing layer includes a first opening;
    a first electrode disposed on the light absorbing layer;
    a second electrode disposed on the first electrode, wherein the second electrode includes an inclined side; and an organic light emitting layer interposed between the first electrode and the second electrode, wherein the first electrode and the second electrode are reflective, and the inclined side of the second electrode overlaps the first opening, thereby light emitted from the organic light emitting layer being guided to the first substrate through the first opening.

17. The organic light emitting display of claim 16, wherein the first electrode and the second electrode defines a second opening disposed on the first opening of the light absorbing layer, wherein the inclined side of the second electrode guides the light through the second opening to the first opening, and wherein the light passing through the second opening arrives to the first opening without reflection.

18. The organic light emitting display of claim 16, further comprising a pixel defined film including an inclined side, wherein the inclined side of the second electrode is formed on the inclined side of the pixel defined film.

* * * * *